United States Patent [19]
Zoroglu
[11] 3,725,151
[45] Apr. 3, 1973

[54] METHOD OF MAKING AN IGFET DEVICE WITH REDUCED GATE-TO-DRAIN OVERLAP CAPACITANCE

[75] Inventor: Demir S. Zoroglu, Phoenix, Ariz.
[73] Assignee: Motorola, Inc., Franklin Park, Ill.

[22] Filed: Oct. 29, 1971
[21] Appl. No.: 193,961

[52] U.S. Cl...................148/187, 148/1.5, 317/235 R
[51] Int. Cl....................................................H01l 7/44
[58] Field of Search ................148/1.5, 187; 317/235

[56] References Cited

UNITED STATES PATENTS

| | | | |
|---|---|---|---|
| 3,479,237 | 11/1969 | Bergh et al. | 156/11 |
| 3,484,313 | 12/1969 | Tauchi et al. | 148/187 |
| 3,519,504 | 7/1970 | Cuomo | 148/187 |

*Primary Examiner*—L. Dewayne Rutledge
*Assistant Examiner*—J. M. Davis
*Attorney*—Vincent Rauner et al.

[57] ABSTRACT

The disclosure teaches a method for producing an IGFET device characterized by an extremely narrow gate area with no overlapping of the source and drain regions. A controlled etch is used to form a pattern in a first layer over the substrate to precisely define the gate width. The substrate is subsequently oxidized so that the material covering the gate area can be preferentially etched away, thereby creating a window precisely defining the gate electrode. The need for precisely registering masks is avoided. A superior IGFET with greater speed of response and other concomitant advantages results.

3 Claims, No Drawings

METHOD OF MAKING AN IGFET DEVICE WITH REDUCED GATE-TO-DRAIN OVERLAP CAPACITANCE

BACKGROUND OF THE INVENTION

This invention relates to insulated gate field effect transistors (hereinafter referred to as IGFETs), and more specifically to problems associated with making an IGFET having a gate area significantly smaller than heretofore obtainable in the prior art, which is, in the same embodiment, without any overlap between gate area and source or drain.

An IGFET is a semiconductor component having three operative areas: source, drain and gate. In the usual form of the device the source and drain areas are discrete diffused areas in a semiconductor substrate. A current flows between source and drain through a part of the substrate known as the channel. An electrode, insulated by a film of oxide or other suitable dielectric, is disposed over the channel. Current flow between source and drain is controlled by an applied voltage in a manner analagous to the operation of a vacuum tube.

The width of the channel is critical, being directly related to the speed of response of the device. The diffusion rate of carriers across the channel places a finite minimum on the time required for a carrier to cross the channel. Beyond a certain critical signal frequency which exists relative each channel width, the variations of the applied signal are so rapid that all of the source injected carriers can not reach the drain before the signal reverses polarity. Carrier recombination occurs resulting in a decrease in the current gain at high frequencies. Thus, other things being equal, the narrower the channel the quicker the speed of response.

Speed of response is also affected by parasitic capacitance. In the construction of an IGFET by the standard photomasking processes of the prior art, the source and drain areas are constructed by diffusing the substrate. A diffusion spreads laterally as well as vertically and, because of this phenomenon, the source and drain regions are larger than the pattern windows through which they are diffused. When the gate electrode is formed in the gate area, there is an overlapping of the electrode with the source and drain areas which creates an undesirable capacitance. The problem is further aggravated by the masking requirements of the prior art which require close registration of the masks in successive steps. A slight error in registration of the masks results in additional parasitic capacitance, all of which diminish the speed of response.

It is therefore an object of this invention to provide an improved method whereby the width and orientation of the gate relative the source and drain may be precisely controlled for the purpose of increasing the speed of response thereof.

SUMMARY OF THE INVENTION

In accordance with the teaching of this invention the method provides a single crystal body of silicon, germanium or the like upon which are formed a first and second layer of dielectric materials of differing composition, each one of which is subject to preferential etching to the exclusion of the other and the substrate. The layers are subjected to mask and etching procedures to produce windows to the substrate surface. A controlled diffusion is made through the windows to create source and drain areas having electrical characteristics contrasting to the substrate. The diffusion creates known underlaps of the diffused areas past the edges of the windows.

A suitable etchant which will preferentially attack the first layer only is then used to undercut the first layer sufficiently to define precisely a gate area, which can be extremely narrow, intermediate the source and drain areas.

The second layer is removed with an etch solution which preferentially attacks the material of that layer.

At this point the substrate is covered only with the remainder of the first layer of dielectric and the diffused source and drain areas occupy an area coextensive with that defined by the windows in the first layer as enlarged by the first-layer etch. Upon the exposed substrate surface defined by the windows a layer of oxide is grown. The purpose of this layer is to protect the integrity of the diffused source and drain areas precisely registering with, but not overlapping, the gate area and to lessen capacitance which might be caused by an accidental overlap of the gate electrode.

After the layer over the window area is formed the exposed first layer is removed, thereby revealing the IGFET gate area on the surface of the substrate.

The IGFET is finished by forming an insulating film of oxide on the gate area and a gate electrode over the now insulated gate area, followed by metallization accomplished according to standard procedures known to the art.

A better understanding of the invention may be gained from the following detailed description, in conjunction with the drawings, in which FIGS. 1 through 5 illustrate the condition of the IGFET during various steps of the process.

DETAILED DESCRIPTION

Figure 1:
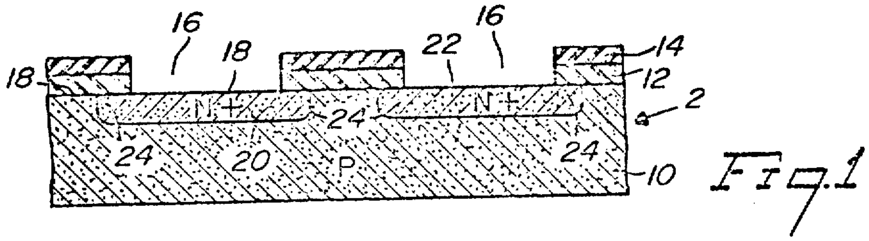

A semiconductor body 2, (FIG. 1) which has been prepared by any suitable prior art process, provides a substrate 10 of monocrystalline silicon (111), doped to exhibit P-type conductivity, for carrying an IGFET structure fabricated according to the steps of this process. If N-channel devices are desired, the starting material could be doped to exhibit N-conductivity. A first layer 12 of silicon nitride is formed on the substrate 10 and a second layer, silica 14 is formed on the first layer 12. The chemical composition of these two layers permits the preferential etching of the layers. Silicon nitride is preferentially etched by, for example, phosphoric acid, whereas silica is preferentially etched by, for example, ammonium bifluoride. These layers are also formed by techniques well known in the art.

Using standard photolithographic processes, windows 16 are cut in layers 12 and 14 to expose the surface 18 of the substrate 10 for diffusions of source and drain areas 20 and 22. The source and drain areas 20, 22 are formed by a standard diffusion process to produce areas having N+ (or P+) conductivity characteristics. Because a diffusion spreads equally in all available directions, an underlap 24 of areas outside the areas defined by windows 16 is expected. It is critical to know the precise extent of the underlap 24 because it will have to be taken into account in a subsequent etch step. It is therefore important that the parameters of the diffusion step be carefully controlled so that the extent of the underlap is precisely known. The extent of the underlap can be controlled, and therefore known, by adjusting the concentration of the impurity atoms, the time of exposure, and the temperature to suit the objective.

Figure 2:
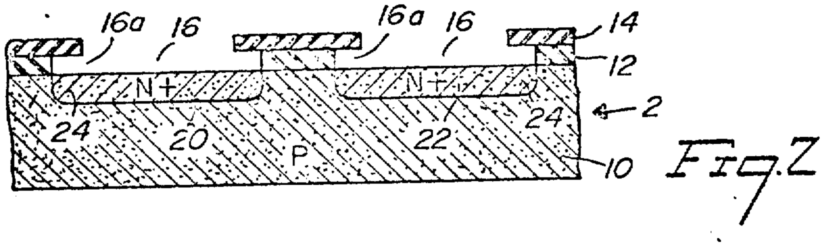

The diffusion of the source and drain 20, 22 having been performed, the first layer 12 is subjected to a preferential etch by treating the silicon nitride of the first layer 12 around the windows 16 with hot phosphoric acid, to which silicon and its oxide are resistant (FIG. 2). The purpose of this step is to etch the silicon nitride layer 12 just enough to cause the windows 16 in the first layer 12 to be enlarged sufficiently to create new windows 16*a* which define the boundaries of the diffused source and drain. Remembering that the extent of the underlap 24 was precisely controlled in a prior step, and that therefore the extent of the underlap 24 is precisely known, it is quite practical to control the standard etch procedure, causing it to remove just enough of the first layer of material surrounding the window 16 to create the desired new window 16*a*. This undercutting etch technique is further disclosed in U. S. Pat. application Ser. No. 193,853 filed concurrently herewith.

Figure 3:
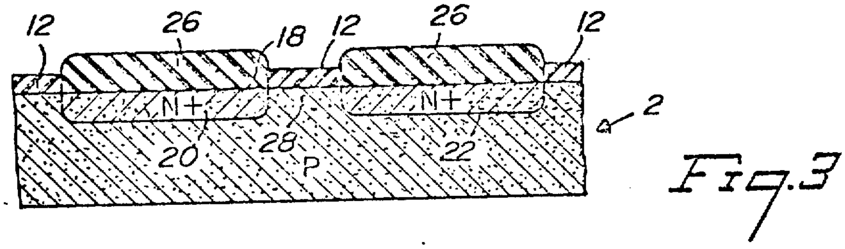

After the etch procedure the second layer 14 is removed with ammonium bifluoride (FIG. 3). The silicon nitride and silicon are resistant to etching by that reagent.

Figure 4:
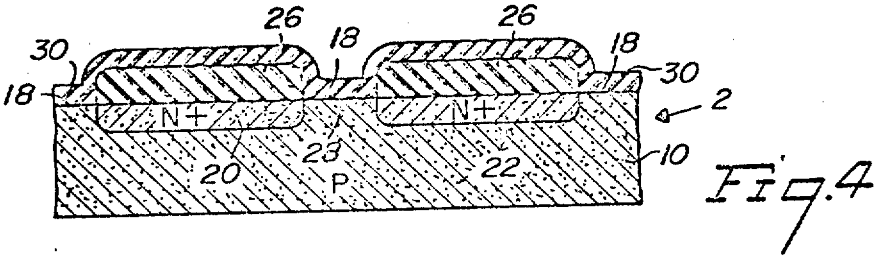

A thick layer of oxide 26 is steam grown over the exposed surface 18 of the substrate 10 at the source and drain areas 20, 22. The layer of oxide 26 will provide insulation against parasitic capacitance between gate and source or drain, and should be a micron or more in thickness. The too-thick silicon nitride layer is removed with hot phosphoric acid, thereby exposing the surface 18 over the channel 28. A layer of oxide 30 of a desired thickness is then steam grown over the channel 28 (FIG. 4) and incidentally over the oxide layer 26 and the remaining surface 18. The layer of oxide 30 serves as insulation between the gate electrode 38 and the channel 28.

It is a distinct advantage of this process that up to this point only one photolithographic masking step has been necessary in forming source, drain and gate areas. Thus the critical requirement of closely registered successive masks is eliminated.

Figure 5:
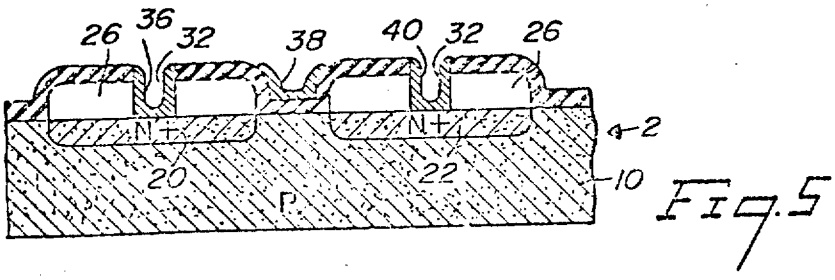

It is now convenient to proceed with metallization to form ohmic contacts and leads to the source, drain and gate areas. By standard photolithographic processes windows 32 are opened to the substrate surface 18 over the source and drain areas 20, 22 (FIG. 5). In this instance the registration of the masks is not at all critical. The tolerance permitted is large by comparison with the capabilities of the art. Next a film of aluminum is deposited over the top surface and a standard mask and etch technique is used to form the source, drain and gate electrodes 36, 38, and 40.

An advantage of this process is that the registration of the mask for the gate electrode 38, in particular, is well within the capabilities of the art. If the registration of the mask is slightly off, the device is protected from parasitic capacitance by the thick dielectric layer of oxide 26.

The method of this invention can be used to produce IGFET devices having gates as narrow as 0.25 micron while reducing the gate capacitance by as much as an order of magnitude compared to standard prior art processes.

Although only one illustrative embodiment has been described, it will be clear to persons ordinarily skilled in the art that various substitutions and modifications in the described process can be made without departing from the scope and spirit of the invention which is bounded by the following claims.

What is claimed is:

1. A method for making an IGFET having source, drain and gate areas which comprises:

providing a semiconductor body having a substrate of one conductivity type;

forming a sandwich thereon composed of first and second layers of dielectric materials of differing compositions, each layer being preferentially etchable without materially affecting the other layer or the substrate;

etching is said sandwich windows to the intended source and drain areas;

diffusing opposite conductivity type producing impurities into said source and drain areas to underlap the areas defined by the windows to a known extent;

undercutting said first layer by preferentially etching it around said windows to define a gate of desired width, the edges of which register with, but do not overlap, said source and drain areas;

removing said second layer;

oxidizing the exposed substrate;

removing said first layer to expose said substrate over the gate area;

forming an insulating film of oxide over the gate area; and metallizing to form ohmic contacts and leads.

2. The invention of claim 1 wherein the substrate is monocrystalline silicon(111) and the first and second layers of said sandwich are composed of silicon nitride and silica respectively.

3. The invention of claim 1 wherein the width of said gate area defined by said undercut first layer is approximately 0.25 micron.

* * * * *

UNITED STATES PATENT OFFICE

CERTIFICATE OF CORRECTION

Patent No. 3,725,151 Dated April 3, 1973

Inventor(s) Demir S. Zoroglu

It is certified that error appears in the above-identified patent and that said Letters Patent are hereby corrected as shown below:

The sheet of drawings containing Figures 1 through 5 as shown on the attached sheet should be added.

Signed and Sealed this

*second* Day of *September 1975*

[SEAL]

*Attest:*

RUTH C. MASON
*Attesting Officer*

C. MARSHALL DANN
*Commissioner of Patents and Trademarks*